United States Patent
Chou et al.

(10) Patent No.: US 7,635,262 B2
(45) Date of Patent: Dec. 22, 2009

(54) LITHOGRAPHIC APPARATUS FOR FLUID PRESSURE IMPRINT LITHOGRAPHY

(75) Inventors: Stephen Y. Chou, Princeton, NJ (US); Hua Tan, Princeton, NJ (US); Wei Zhang, Princeton, NJ (US)

(73) Assignee: Princeton University, Princeton, NJ (US)

( * ) Notice: Subject to any disclaimer, the term of this patent is extended or adjusted under 35 U.S.C. 154(b) by 0 days.

(21) Appl. No.: 10/637,838

(22) Filed: Aug. 8, 2003

(65) Prior Publication Data

US 2004/0131718 A1 Jul. 8, 2004

Related U.S. Application Data

(60) Continuation-in-part of application No. 10/140,140, filed on May 7, 2002, now Pat. No. 7,137,803, which is a division of application No. 09/618,174, filed on Jul. 18, 2000, now Pat. No. 6,482,742, application No. 10/637,838, which is a continuation-in-part of application No. 10/046,594, filed on Oct. 29, 2001.

(51) Int. Cl.
*B29C 59/02* (2006.01)
(52) U.S. Cl. .................. 425/385; 425/387.1; 425/389; 425/149; 425/150
(58) Field of Classification Search ............ 425/387.1, 425/388, 389, 405.1, 405.2, 143, 150, 149; 977/887
See application file for complete search history.

(56) References Cited

U.S. PATENT DOCUMENTS

| | | | | |
|---|---|---|---|---|
| 4,331,736 A | * | 5/1982 | Schafer et al. ........... 428/425.6 |
| 5,234,717 A | * | 8/1993 | Matsuno et al. ............. 427/277 |
| 5,326,240 A | * | 7/1994 | Kudo et al. .................... 425/3 |
| 5,370,760 A | * | 12/1994 | Mori et al. ............... 156/89.16 |
| 5,427,599 A | * | 6/1995 | Greschner et al. ............. 65/305 |
| 5,643,522 A | * | 7/1997 | Park ........................... 264/313 |
| 5,772,905 A | * | 6/1998 | Chou ........................... 216/44 |
| 5,820,894 A | * | 10/1998 | Kreutzer ..................... 425/389 |
| 5,863,452 A | * | 1/1999 | Harshberger et al. .......... 249/83 |

(Continued)

FOREIGN PATENT DOCUMENTS

DE 3643817 6/1988

(Continued)

OTHER PUBLICATIONS

M. Colburn et al., "Step and Finish Imprint Lithography: A New Approach to High-Resolution Patterning", Mar. 1999, Texas Materials Institute, The University of Texas at Austin Texas, Part of the SPIE Conference on Emergining Lithographic Technologies, III (pp. 379-389).

*Primary Examiner*—Yogendra Gupta
*Assistant Examiner*—Emmanuel S Luk
(74) *Attorney, Agent, or Firm*—Polster, Lieder, Woodruff & Lucchesi, LC (57) ABSTRACT

Improved apparatus for imprint lithography involves using direct fluid pressure to press a mold into a substrate-supported film. Advantageously the mold and/or substrate are sufficiently flexible to provide wide area contact under the fluid pressure. Fluid pressing can be accomplished by sealing the mold against the film and disposing the resulting assembly in a pressurized chamber. The result of this fluid pressing is enhanced resolution and high uniformity over an enlarged area.

29 Claims, 8 Drawing Sheets

U.S. PATENT DOCUMENTS

| | | | |
|---|---|---|---|
| 5,947,027 A | 9/1999 | Burgin et al. | |
| 7,114,938 B2 * | 10/2006 | Chou | 425/126.1 |
| 7,137,803 B2 * | 11/2006 | Chou | 425/405.1 |
| 2002/0094496 A1 * | 7/2002 | Choi et al. | 430/322 |

FOREIGN PATENT DOCUMENTS

| | | |
|---|---|---|
| EP | 0691551 A1 | 1/1996 |
| EP | 0794016 A1 | 9/1997 |
| WO | WO0142858 A1 | 6/2001 |

* cited by examiner

LITHOGRAPHIC APPARATUS FOR FLUID PRESSURE IMPRINT LITHOGRAPHY

CROSS REFERENCE TO RELATED APPLICATIONS

This application is continuation-in-part of U.S. patent application Ser. No. 10/140,140 filed May 7, 2002 now U.S. Pat. No. 7,137,803 and entitled "Fluid Pressure Imprint Lithography". Ser. No. 10/140,140, in turn, is a divisional of U.S. patent application Ser. No. 09/618,174 filed Jul. 18, 2000 (now U.S. Pat. No. 6,482,742 issued Nov. 19, 2002). The foregoing '140 application, '174 application and '742 patent are each incorporated herein by reference.

This application is also a continuation-in-part of U.S. patent application Ser. No. 10/046,594 filed on Oct. 29, 2001, which claims priority to U.S. patent application Ser. No. 09/107,006 filed Jun. 30, 1998 (now U.S. Pat. No. 6,309,580 issued Oct. 30, 2001) and which, in turn, claims priority to U.S. patent application Ser. No. 08/558,809 filed on Nov. 15, 1995 (now U.S. Pat. No. 5,772,905 issued Jun. 30, 1998). The foregoing Jan. 27, 2003 application, the '594 application, the '006 application and the '809 application are each incorporated herein by reference.

GOVERNMENT INTEREST

This invention was supported in part under DARPA, Grant N66001-98-1-8900. The government has certain rights in the invention.

FIELD OF THE INVENTION

This invention relates to apparatus for performing imprint lithography wherein direct fluid pressure is used to press a mold into a thin film. The apparatus is particularly useful to provide nanoimprint lithography of enhanced resolution and uniformity over an increased area.

BACKGROUND OF THE INVENTION

Lithography is a key process in the fabrication of semiconductor integrated circuits and many optical, magnetic and micromechanical devices. Lithography creates a pattern on a thin film carried on a substrate so that, in subsequent process steps, the pattern can be replicated in the substrate or in another material which is added onto the substrate.

Conventional lithography typically involves applying a thin film of resist to a substrate, exposing the resist to a desired pattern of radiation, and developing the exposed film to produce a physical pattern. In this approach, resolution is limited by the wavelength of the radiation, and the equipment becomes increasingly expensive as the feature size becomes smaller.

Nanoimprint lithography, based on a fundamentally different principle offers high resolution, high throughput, low cost and the potential of large area coverage. In nanoimprint lithography, a mold with nanoscale features is pressed into a thin film, deforming the shape of the film according to the features of the mold and forming a relief pattern in the film. After the mold is removed, the thin film can be processed to remove the reduced thickness portions. This removal exposes the underlying substrate for further processing. Details of nanoimprint lithography are described in applicant's U.S. Pat. No. 5,772,905 issued Jun. 30, 1998 and entitled "Nanoimprint Lithography". The '905 patent is incorporated herein by reference.

The usual method of pressing the mold into the thin film involves positioning the mold and the substrate on respective rigid plates of a high precision mechanical press. With such apparatus, the process can generate sub-25 nm features with a high degree of uniformity over areas on the order of 12 in 2. Larger areas of uniformity would be highly advantageous to increase throughput and for many applications such as displays.

SUMMARY OF THE INVENTION

Improved apparatus for imprint lithography involves using direct fluid pressure to press a mold into a substrate-supported film. Advantageously the mold and/or substrate are sufficiently flexible to provide wide area contact under the fluid pressure. Fluid pressing can be accomplished by sealing the mold against the film and disposing the resulting assembly in a pressurized chamber. The result of this fluid pressing is enhanced resolution and high uniformity over an enlarged area.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawing are for purposes of illustrating the concepts of the invention and are not to scale.

DETAILED DESCRIPTION

The use of a high precision mechanical press to press a mold into a thin film presents tolerance problems in replicating small patterns over large areas. Presses move on guide shafts through apertures, and the spacings between the shafts and their respective apertures can be large compared to the features to be replicated. Such spacings permit undesirable relative translational and rotational shifts between the substrate and the mold. Moreover, despite the most careful onstruction, the molds and the substrates used in lithography are not perfectly planar. When these molds and substrates are disposed on the rigid plates of a press, the deviations from planarity over large areas can result in variations in the molding pressure and depth of imprint. Accordingly, it is desirable to provide a method of imprint lithography which avoids the limitations of mechanical presses.

In accordance with the invention, the problem of unwanted lateral movements of mechanical presses is ameliorated by using direct fluid pressure to press together the mold and the moldable surface. The inventive methods apply fluid pressure over a surface of the mold, the substrate supporting the moldable surface or both. Because the fluid pressure is isostatic, no significant unbalanced lateral forces are applied. Direct fluid pressure also includes fluid pressure transmitted to the mold or substrate via a flexible membrane, as it does not interfere with the transmission of isostatic pressure from the fluid. And streaming pressurized fluid from numerous openings in a pressure vessel can also apply nearly isostatic direct fluid pressure on the mold or substrate.

It is contemplated that the invention will have important applications in the molding of a pattern on a previously patterned substrate. The mold can be aligned with the previous pattern using conventional alignment techniques, and imprinting by direct fluid pressure minimizes any relative lateral shifts with consequent improvement in the alignment of the two patterns.

This description is divided into two parts: Part I describes the method of fluid pressure imprint lithography, and Part II describes apparatus for performing the method.

I. Fluid Pressure Imprint Lithography

Figure 1:
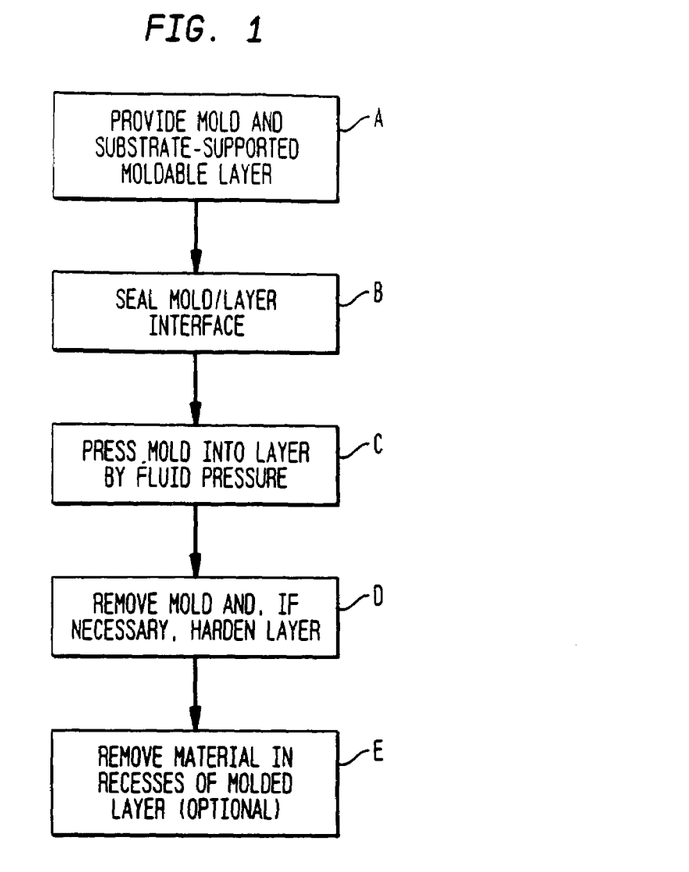
FIG. 1 is a schematic flow diagram of the steps in an improved method of imprint lithography.

Referring to the drawings, FIG. 1 is a schematic flow diagram of an improved process for imprint lithography using direct fluid pressure. An initial step shown in Block A, is to provide a mold having a plurality of protruding features and a substrate-supported thin film of moldable material. The protruding features are preferably micrometer scale features and, more advantageously, nanoscale features. The method is highly advantageous where the mold surface has at least two protruding features spaced apart by at least one lateral dimension less than 200 nm. A moldable material is one which retains or can be hardened to retain the imprint of protruding features from a mold surface.

Figure 2:
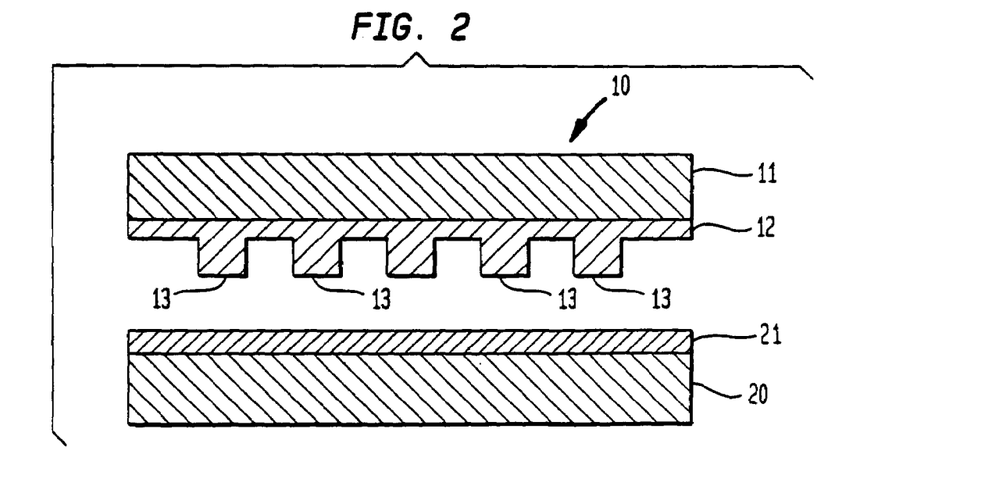
FIG. 2 illustrates a typical mold and a substrate bearing a moldable film for use in the improved method of FIG. 1.

FIG. 2 illustrates a typical mold 10 with protruding features and a substrate 20 bearing a moldable thin film 21 for use in the process of FIG. 1. The mold comprises a body 11 and a molding layer 12 including a plurality of protruding features 13 having a desired shape. The mold body 11 and the molding layer 12 are typically fused quartz, glass or ceramic. The molding layer 12 can be patterned into features 13 of nanoscale dimensions using electron beam lithography and etching techniques well known in the art. The thickness of layer 21 is typically in the range 0.1 nm-10 μm, and the extent of protruding features 13 is typically in the range 0.1 nm-10 μm. The substrate typically comprises a semiconductor wafer such as a substantially planar wafer of monocrystalline silicon. The substrate could also be plastic, glass or ceramic. The moldable thin film 21 can be any polymer that can be made pliable to pressure and can retain a pressure-imprinted deformation or pattern. It can be a thermoplastic polymer, such as polycarbonate or polymethyl methacrylate (PMMA), which temporarily softens in response to heat. Alternatively it can be a liquid, such as a UV-curable silicone, which hardens in response to radiation or a liquid which cures with heat. It can also be a composite layer of polymer and hardenable liquid. The thin film is typically applied to the substrate by spraying or spinning. Advantageously the film polymer does not adhere to the mold surface. If necessary, the mold surface can be coated with a release agent to prevent such adherence.

In high resolution applications, the mold and the substrate are advantageously made of the same material in order to minimize misalignment due to differential thermal expansion or contraction.

Preferably the mold body 11, the substrate 20 (or both) is flexible so that, under the force of fluid pressure, the mold and the substrate will conform despite deviations from planarity. Silicon substrates of thickness less than 2 mm exhibit such flexibility for typical imprint pressures.

The next step, shown in Block B, is to place the mold and the thin-film together and to seal the interface of the mold with the thin film, forming a mold/film assembly. If the thin film already includes a previously formed pattern, then the pattern of the mold should be carefully aligned with the previous pattern on the film in accordance with techniques well known in the art. The objective of the sealing is to permit external fluid pressure to press the mold into the film. The sealing can be effected in a variety of ways such as by providing a ring of material such as an elastomeric gasket around the area to be molded and peripherally clamping the assembly.

The third step (Block C) is to press the mold into the film by direct fluid pressure. One method for doing this is to dispose the assembly in a pressure vessel and introduce pressurized fluid into the vessel. The advantage of fluid pressure is that it is isostatic. The resulting force uniformly pushes the mold into the thin film. Shear or rotational components are de minimus. Moreover since the mold and/or substrate are flexible rather than rigid, conformation between the mold and the film is achieved regardless of unavoidable deviations from planarity. The result is an enhanced level of molding resolution, alignment and uniformity over an increased area of the film. The pressurized fluid can be gas or liquid. Pressurized air is convenient and typical pressures are in the range 1-1000 psi. The fluid can be heated, if desired, to assist in heating the moldable thin film. Cooled fluid can be used to cool the film.

Figure 3:
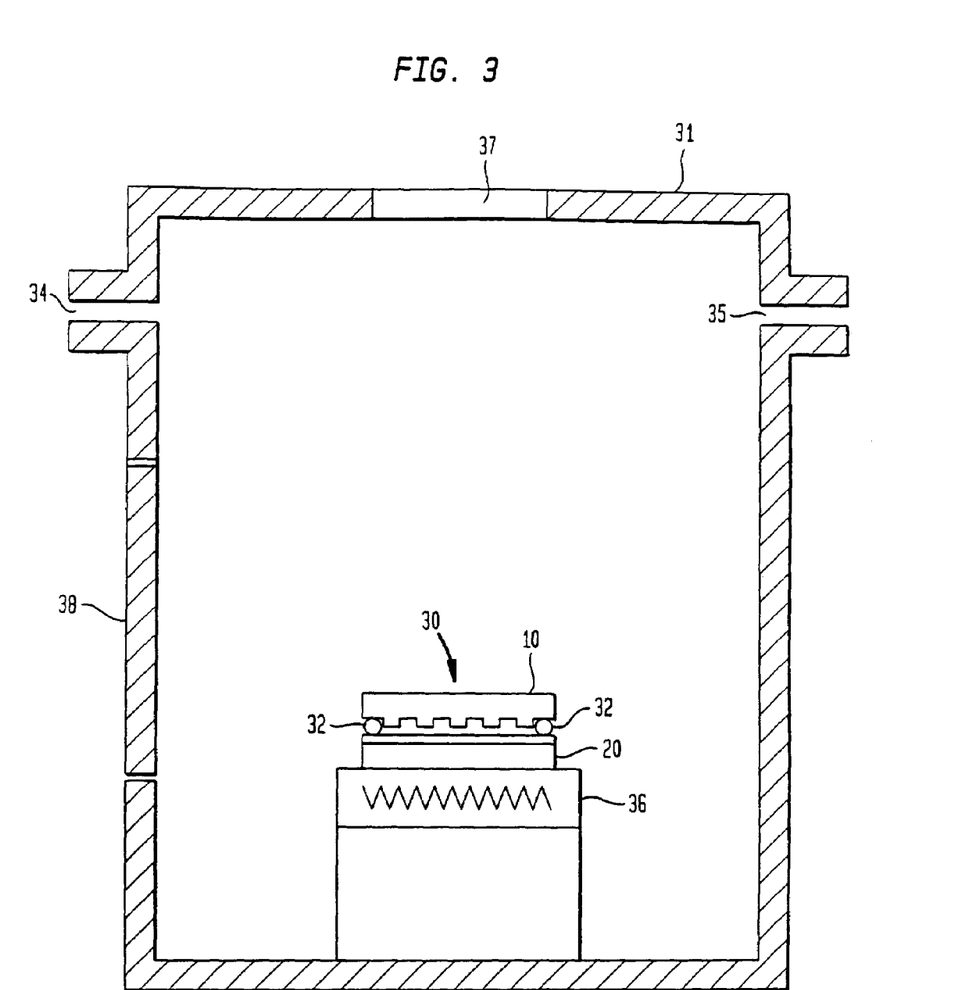
FIG. 3 illustrates apparatus for practicing the improved method of FIG. 1.

FIG. 3 illustrates a sealed mold/film assembly 30 disposed within a pressure vessel 31. The assembly 30 is sealed by a peripheral elastomeric gasket 32, extending around the area to be molded. The periphery of the assembly can be lightly clamped by a clamp (not shown) to effectuate the seal. The vessel 31 preferably includes a valve-controlled inlet 34 for the introduction of pressurized fluid and a valve controlled outlet 35 for the exit of such fluid. The vessel 31 may optionally include a heater 36 for heating a thermoplastic or heat curable thin film and/or a transparent window 37 for introducing radiation to cure or cross link the film. A scalable door 38 can provide access to the interior of the vessel.

The next step shown in Block D, is to harden the moldable thin film, if necessary, so that it retains the imprint of the mold and to remove the mold. The process for hardening depends on the material of the thin film. Some materials will maintain the imprint with no hardening. Thermoplastic materials can be hardened by preliminarily heating them prior to molding and permitting them to cool after imprint. PMMA, for example, can be suitably softened by heating to 200° C. prior to molding and hardened by cooling after imprint. Heat curable materials can be hardened by applying heat during imprint. The above-described heater 36 and/or the use of a heated pressurized fluid can effectuate such hardening. Radiation curable materials can be hardened by the application of UV radiation during imprint. Such radiation can be supplied through the window 37 of the pressure vessel. The mold can be made of transparent material to permit the radiation to reach the film. Alternatively, the substrate can be transparent and the window positioned to illuminate the film through the substrate.

The fifth step shown in Block E is optional in some applications. It is to remove contaminants (if any) and excess material from the recesses of the molded thin film. The molded film will have raised features and recesses. In many lithographic operations it is desirable to eliminate the material from the recesses so that the underlying substrate is exposed for further processing. This can be conveniently accomplished using reactive ion etching.

Figure 4A:
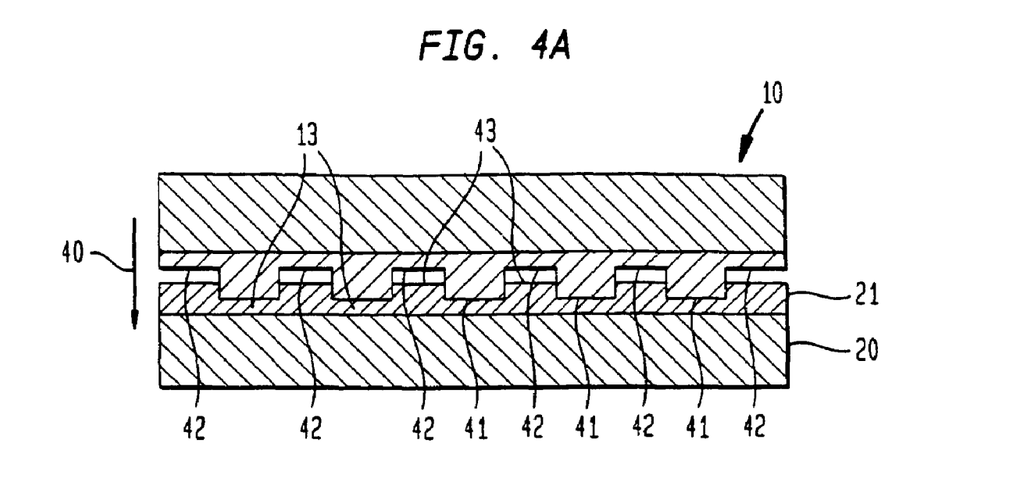
FIGS. 4A, 4B and 4C show the moldable layer and substrate at various stages of the process of FIG. 1.

FIGS. 4A, 4B and 4C show the moldable layer and substrate at various stages of the process. FIG. 4A illustrates the layer 21 during imprinting by mold 10 pressed by fluid pressure in the direction of arrow 40. The protruding features 13 of the mold press into layer 21, producing thinned regions 41. The recessed regions 42 of the mold between successive protruding features leave layer 21 with regions 43 of greater thickness.

Figure 4B:
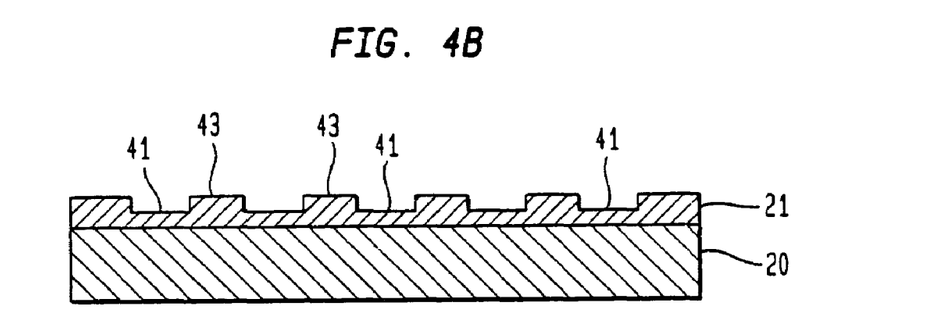

FIG. 4B shows the layer 21 after hardening and removal of the mold. The layer 21 retains the thinned regions 41 and thick regions 43 in accordance with the pattern imprinted by the mold.

Figure 4C:
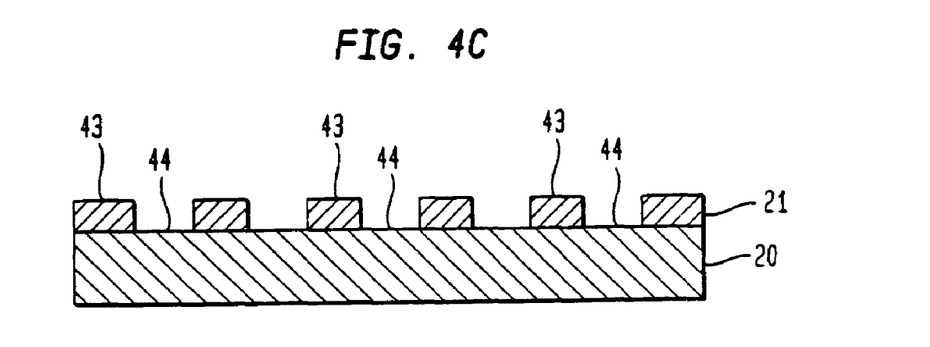

FIG. 4C illustrates the layer and substrate after removal of the excess layer material in the recesses, exposing nanoscale regions 44 of the substrate 20.

In important applications the resulting structure is a resist-covered semiconductor substrate with a pattern of recesses extending to the substrate as shown in FIG. 4C. Such a structure can be further processed in a variety of ways well-known in the art. For example, the molded film can be used as a mask for the removal of surface layers in exposed regions of the substrate, for doping exposed regions or for growing or depositing materials on the exposed regions.

Figure 5A:
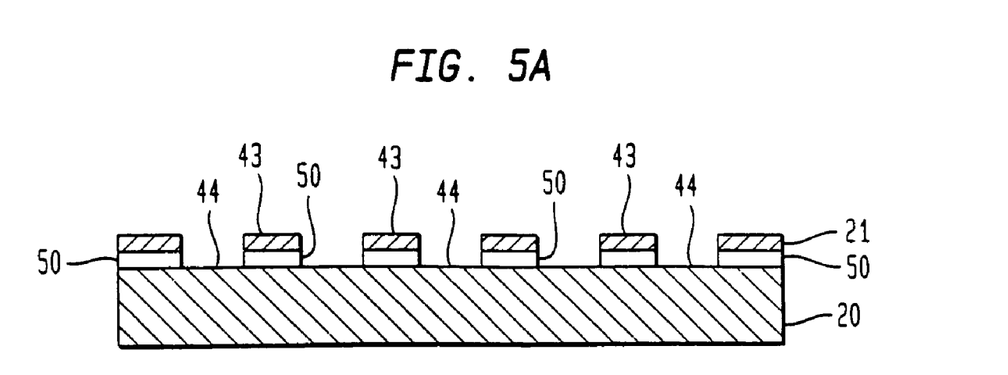
FIGS. 5A, 5B and 5C illustrate various further processing steps that can be performed on the substrate.
Figure 5B:
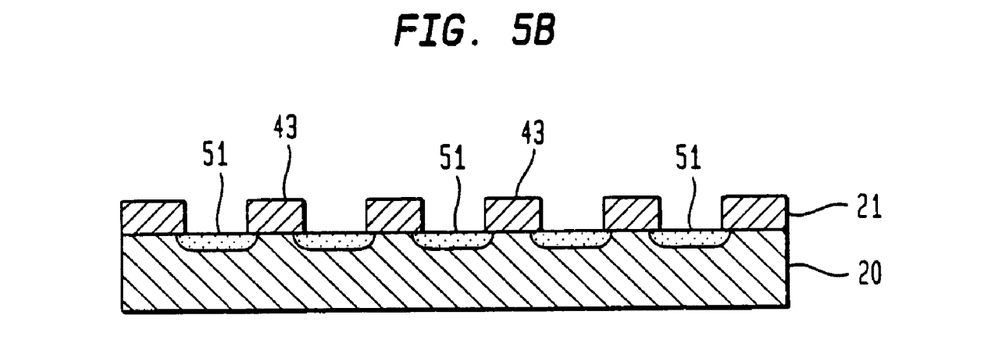
Figure 5C:
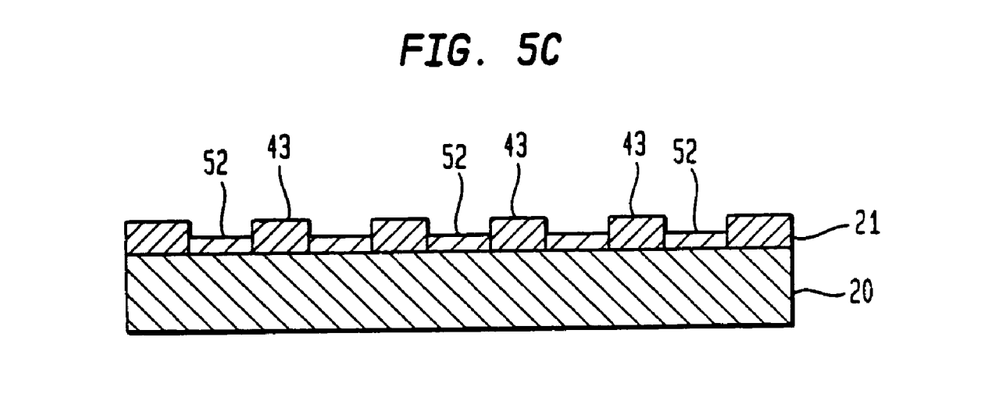

FIGS. 5A, 5B and 5C illustrate such further processing. In FIG. 5A, the substrate can include a surface dielectric layer 50 (such as SiO2 on Si) and the mask layer can permit removal of the dielectric at exposed regions. In FIG. 5B impurity regions 51 can be diffused or implanted into the semiconductor selectively in those regions which are exposed, altering the local electrical or optical properties of the doped regions. Alternatively, as shown in FIG. 5C new material layers 52 such as conductors or epitaxial layers can be deposited or grown on the exposed substrate within the recesses. After processing, the remaining material of the molded layer can be removed, if desired, using conventional techniques. PMMA, for example, can be cleaned away by washing with acetone. A substrate can be subjected to additional lithographic steps to complete a complex device such as an integrated circuit.

II. Apparatus for Fluid Pressure Imprint Lithography

We now turn to apparatus useful in performing the process of FIG. 1. As mentioned above, there are a variety of ways of sealing the mold/film assembly 30 so that pressurized fluid will press the mold into the film. FIGS. 6A-6D illustrate several of these ways.

Figure 6A:
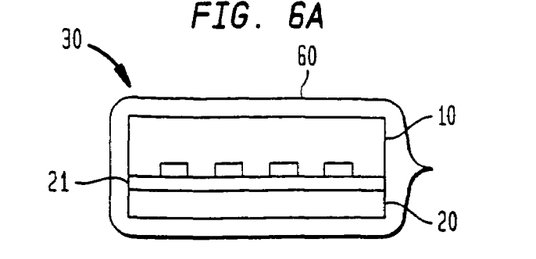
FIGS. 6A-6E illustrate alternative sealing arrangements useful in the method of FIG. 1.

FIG. 6A schematically illustrates an arrangement for sealing a mold/film assembly by disposing the assembly within a sealed covering of flexible, fluid-impermeable membrane 40 (e.g. a plastic bag). In this arrangement the region between the mold and the moldable layer is sealed in relation to an external pressure vessel. Preferably the air is removed from the bag before molding.

Figure 6B:
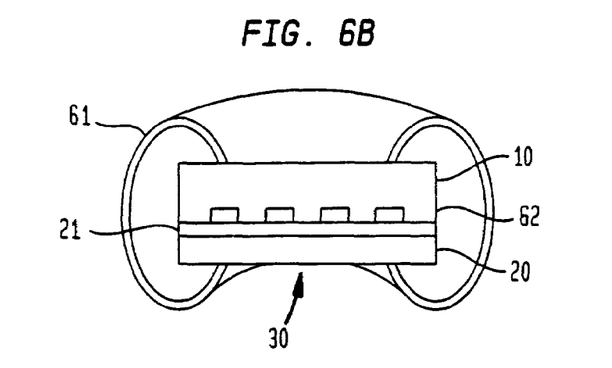

FIG. 6B shows an alternate sealing arrangement wherein the assembly 30 is sealed by a peripheral sealing clamp 61 which can be in the form of a hollow elastic torroid. Sealing can be assisted by providing the mold with a protruding region 62 extending around the region to be molded. In use, the clamp and pressurized fluid will press the protruding region 62 into the moldable film, sealing the molding region.

Figure 6C:
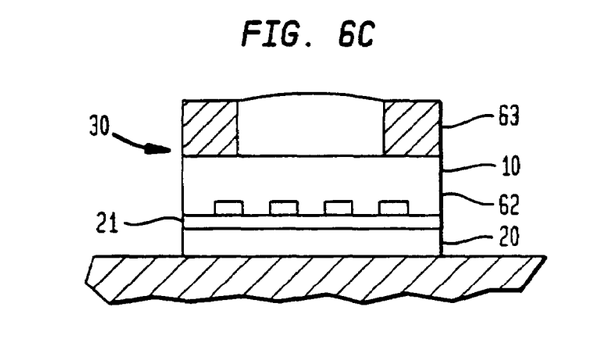

FIG. 6C illustrates a sealing arrangement in which the assembly 30 is sealed by applying a peripheral tube or weight 63 which lightly presses the mold onto the moldable film. A peripheral protruding region 62 can assist sealing.

Figure 6D:
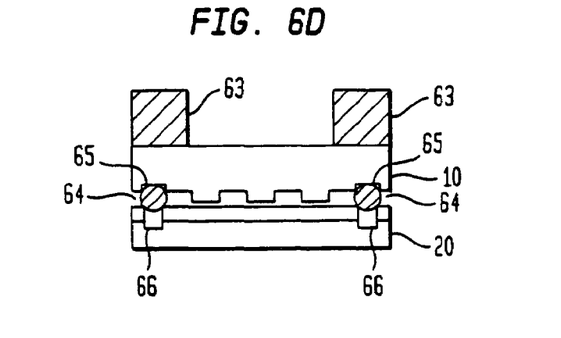

FIG. 6D shows an alternative sealing arrangement wherein the assembly 30 is sealed by a sealing o-ring 64 between the mold and the substrate. Preferably the o-ring seats within peripheral recesses 65, 66 in the mold and the substrate, respectively. Light pressure from a peripheral tube or weight 63 can assist sealing.

Figure 6E:
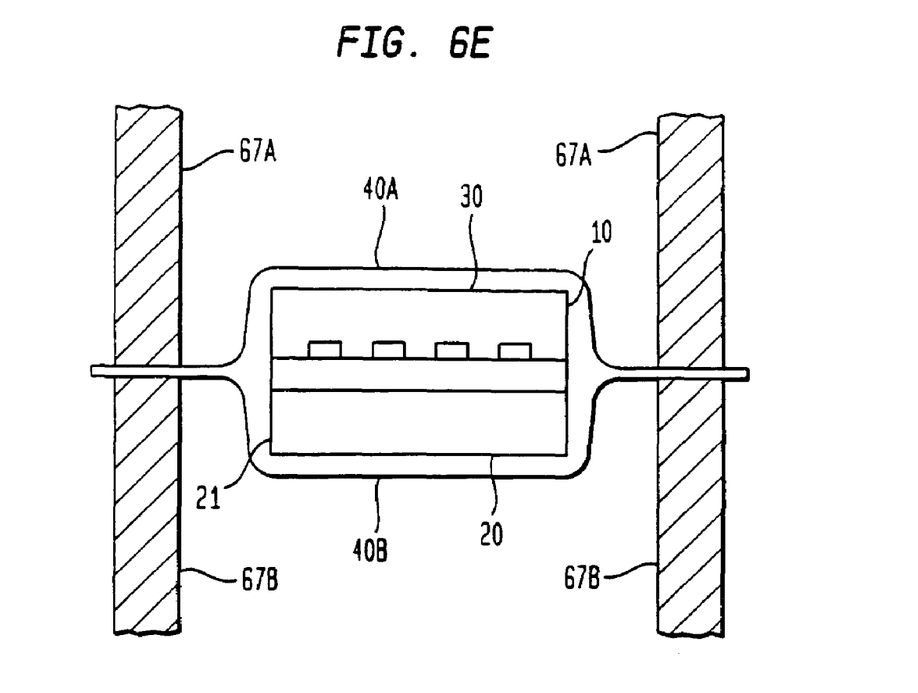

FIG. 6E shows yet another sealing arrangement in which the assembly 30 is disposed between flexible membranes 40A and 40B is enclosed within a pair of mating cylinders 67A, 67B. Application of fluid pressure to the interior of the cylinders would press the mold and moldable surface together.

Alternatively, two the cylinders could lightly seal against the mold and the substrate, respectively, before pressurization. Yet further in the alternative, the substrate could rest upon a support and a single cylinder lightly seal against the mold or a membrane.

Figure 7:
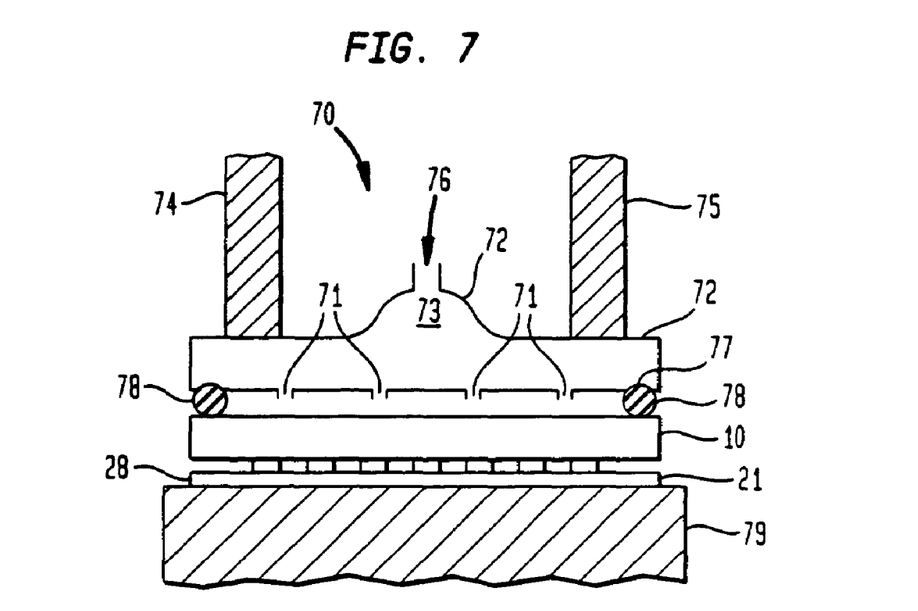
FIG. 7 shows alternative apparatus for practicing the method of FIG. 1.

FIG. 7 illustrates alternative molding apparatus 70 where the assembly is disposed adjacent openings 71 in a hollow pressure cap 72 and the mold 10 is pressed into the moldable layer 21 by jets of pressurized fluid escaping through the openings 71. The cap 72 (analogous to vessel 31) has an internal chamber 73 for pressurized fluid. The region between the mold and the moldable film is effectively sealed from the pressure vessel by the upper surface of the mold.

In operation, the substrate and mold are placed on a substrate holder 79. The cap 72 can be held in fixed position above the mold 10, as by bars 74, 75. High pressure fluid, preferably gas, is pumped into chamber 73 through an inlet 76. The high pressure fluid within the chamber produces a fluid jet from each opening 71. These jets uniformly press the mold 10 against the moldable layer to imprint the mold features.

Advantageously, the cap 72 can include a groove 77 along a perimeter of the face adjacent the mold 10. The groove 77 can hold an o-ring 78 between the cap 72 and the mold 20. The o-ring decreases fluid outflow between the cap 72 and the mold 10, increasing the molding pressure and making it more uniform.

Alternatively, the substrate holder 79 can have the same structure as cap 72 so that the substrate is also pressed by jets of pressurized fluid.

Figure 8:
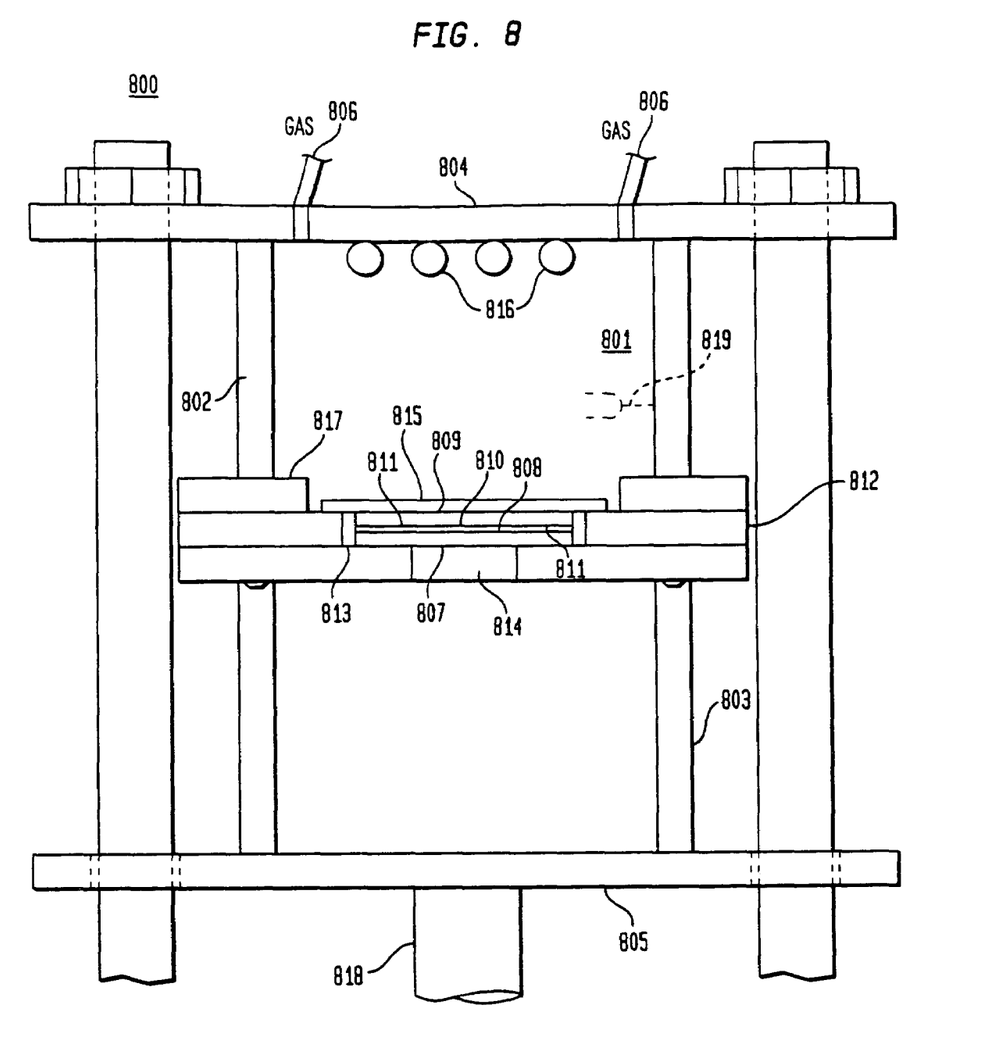
FIG. 8 illustrates additional lithographic apparatus for practicing fluid imprint lithography.

FIG. 8 is a schematic cross section of an additional apparatus 800 for practicing fluid pressure imprint lithography comprising a pressure chamber 801 formed by cylindrical sections 802 and 803 closed by planar top section 804 and planar bottom 805. The chamber 801 is coupled to a controllable pressure fluid source (not shown) as through openings 806 in the top section 804. Disposed within the chamber 800 is a substrate 807 having a moldable surface 808 and a mold 809 having a molding surface 810 facing the moldable surface 808. The molding surface 810 has at least one protruding feature (not shown).

In an advantageous embodiment, the substrate 807 and mold 809 have alignment features 811 which permit their precise alignment prior to the imprinting step.

Also advantageously, the aligned substrate and mold are disposed on a tray 812 which can be withdrawn from chamber 801, loaded with the substrate and mold and inserted into the chamber. The tray 812 preferably includes shoulders 813 for supporting the substrate and mold and an opening 814 underlying the substrate. A fluid impermeable layer 815 is disposed between the fluid source openings 806 and the substrate and the mold.

The upper cylindrical section 802, which can include heating lamps 816 is fixed between planar top 804 and a fixed bottom plate 817. The lower cylindrical section 803 is fixed to planar bottom 805, but the bottom 805 is advantageously movable up via piston rod 818. Upward movement of rod 818 forces cylindrical section 803 into sealing engagement with tray 812.

In operation, the tray 812 is withdrawn from the chamber, and the substrate and mold in aligned relation are disposed on the shoulders 813. The thus loaded tray is inserted into the chamber 801, underlying impermeable layer 815 as shown in FIG. 1.

Lower cylindrical section 803 is then moved into sealing engagement with the bottom of tray 812 and, advantageously, also forces the tray 812 into sealing engagement with plate 817. The substrate and mold are thus disposed in a sealed pressure chamber. Lamps 816 are turned on if it is desired to heat the mold or the moldable surface.

Pressurized fluid is then introduced through openings 806 into the upper cylindrical section 802. The pressurized fluid, acting on flexible impermeable layer 815, presses the mold into the moldable surface of the substrate. The pressure is then released, the tray withdrawn from the chamber, and the mold is carefully removed from the substrate.

In various alternative embodiments, the upper cylinder and/or the lower cylinder can be provided with heating or cooling elements to heat or cool the mold and/or substrate. Moreover the upper and/or the lower cylinder end plates can be made of transparent material such as fused silica to permit the introduction of laser radiation. If the mold and/or substrate is also transparent, the radiation can reach the moldable surface to soften the surface or to induce cross linking of the moldable surface material.

It is contemplated that the apparatus of FIGS. 6, 7 and 8 can be used in automated systems. In such systems, as a preliminary step, the mold and the substrate would be automatically aligned, sealed, heated and subjected to pressurized fluid, all under a programmed controller. In the apparatus of FIG. 8, for example, an automatic positioner 819 (shown by dashed lines) could position the mold 809 in alignment on the substrate 807.

Figure 9:
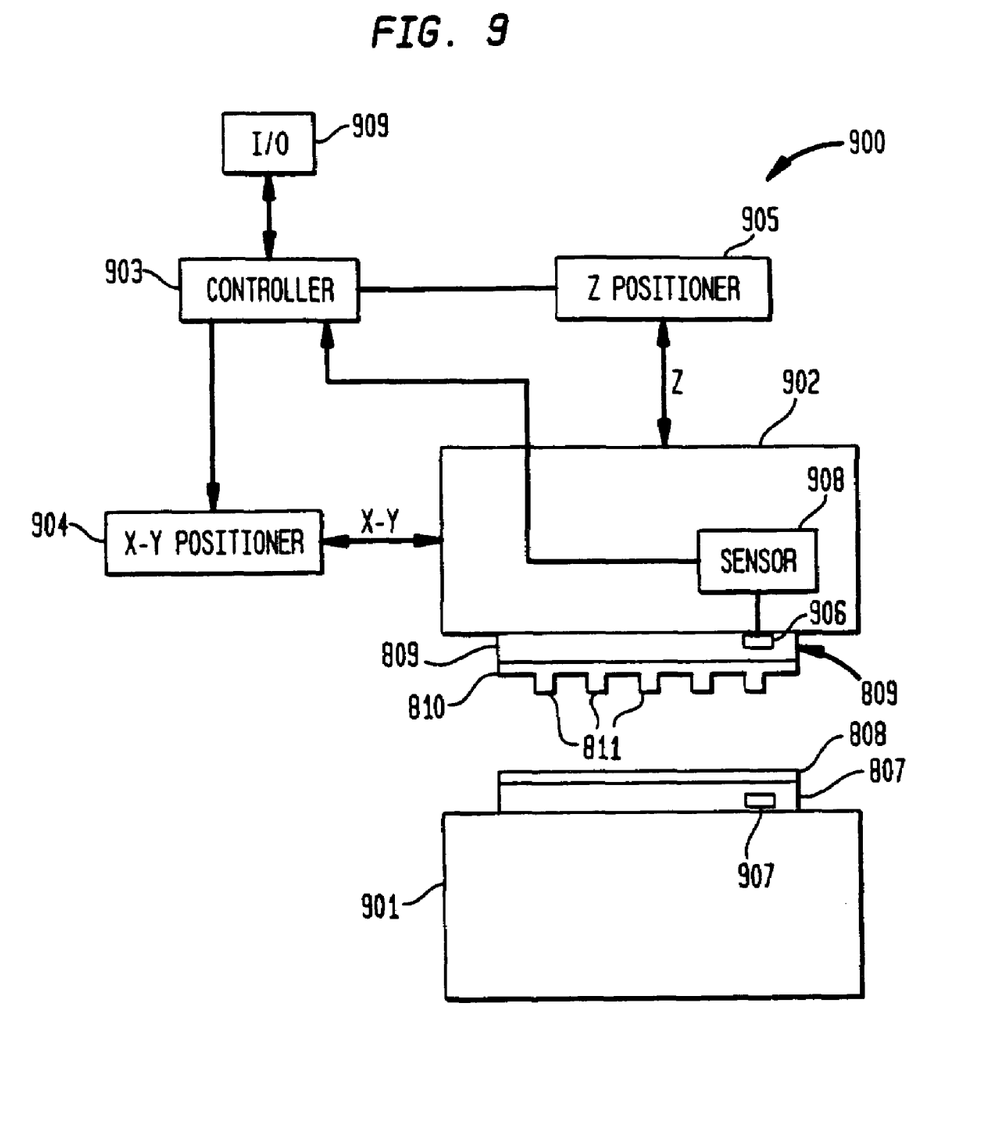
FIG. 9 is a schematic block diagram of a system for automating the apparatus of FIGS. 6, 7 or 8.

FIG. 9 is a simplified block diagram of apparatus 900 for automating nanoimprint lithography in accordance with the invention. Apparatus 900 includes stationary block 901 carrying substrate 807 and moveable molding block 902 carrying mold 804. A controller 903 couples to x-y positioner 904 and z-positioner 905. An alignment mark, 906 is on mold 809 and a complimentary mark 907 on substrate 807. Sensor 908 carried in block 902 couples to alignment marks 906 and 907 and provides an alignment signal to controller 903. Controller 903 is also provided with input output circuitry 909.

In operation, controller 903 controls the imprinting of mold 809 into film on substrate 807. During the imprinting process, precise alignment of mold 809 and substrate 807 is crucial. This is achieved using optical or electrical alignment techniques. For example, sensor 908 and alignment marks 906 and 907 may be an optical detector and optical alignment marks which generate a moire alignment pattern such that moire alignment techniques may be employed to position mold 809 relative to substrate 807. Such techniques are described by Nomura et al. A MOIRE ALIGNMENT TECHNIQUE FOR MIX AND MATCH LITHOGRAPHIC SYSTEM. J. Vac. Sci. Technol. B6<1), January/February DEFRACTED MOIRE SIGNALS J. Vac. Sci. Technol. B7(6), November/December 1989, Pg. 1977. Controller 903 processes this alignment information and adjusts the position of block 902 in the x-y plane relative to substrate 807 using x-y positioner 904. In another embodiment, alignment marks 906 and 907 comprise plates of a capacitor such that sensor 908 detects capacitance between marks 906 and 907. Using this technique, alignment is achieved by moving block 902 in the x-y plane to maximize the capacitance between alignment marks 906 and 907. The controller directs imprinting by controlling the introduction and removal of pressurized fluid into the pressure chamber. The controller 903 may monitor and control the temperature of the substrate 807.

The heating of the substrate can be supplied by a radiation heating, which can be provided by a light source or light sources. The radiation sources can radiate from one side of the wafer and mask assembly or from several sides or from all sides.

The chamber of the apparatus can be opened or closed by a piston or a screw-powered lift. The chamber will be evacuated by a vacuum pump.

EXAMPLES

The invention may now be better understood by consideration of the following specific examples.

Example 1

A silicon wafer of 4" diameter is coated with a layer of PMMA 150 nm thick. A mold is made of a 4" diameter silicon wafer and has plural silicon dioxide protruding patterns 100 nm thick on one side of its surface. The mold is placed on the PMMA layer with the protruding patterns facing the PMMA. The mold and the substrate are sealed in a plastic bag within a chamber, and the chamber is evacuated. Then nitrogen gas at 500 psi is introduced in the chamber. A heater in the chamber heats the PMMA to 170° C., which is above the glass transition temperature of the PMMA, softening the PMMA. Under the gas pressure, the mold is pressed into the PMMA. After turning off the heater and introducing a cold nitrogen gas, the PMMA temperature drops below its glass transition temperature, and the PMMA hardens. Then the nitrogen gas is vented to the atmosphere pressure. The mold and substrate assembly is removed from the chamber. The bag is cut off, and the mold is separated from the substrate.

Example 2

A silicon wafer of 4" diameter is coated with a layer of PMMA 150 nm thick and is placed on a chuck. The chuck has a plurality of small holes on its surface. The holes can be connected either to vacuum or to pressurized gas. When the holes are connected to vacuum, the chuck holds the wafer on the chuck's surface. A mold made of a 4" diameter silicon wafer has a plurality of silicon dioxide protruding patterns (100 nm thick) on one of its surface. The mold is held by a second chuck, which has the same design as the substrate chuck. The mold is placed on top of the PMMA layer with the protruding patterns facing the PMMA. The mold and the substrate are placed in a chamber. The PMMA can be heated from the chuck.

During the imprint process, the PMMA is first heated above its glass transition temperature. A ring pattern on the mold seals off the mold pattern inside the ring from the pressure outside. Then the holes of both chucks are changed from vacuum to a gas pressure of 500 psi. The pressurized gas presses the mold protruding patterns into PMMA. Importantly, the pressurized gas presses the mold protruding pattern into the PMMA uniformly in submicron scale, despite the roughness of the backsides of the mold and the substrate as well as the roughness of the chuck surfaces.

It is to be understood that the above described embodiments are illustrative of only a few of the many embodiments which can represent applications of the invention. Numerous and varied other arrangements can be made by those skilled in the art without departing from the spirit and scope of the invention.

We claim:

1. An apparatus for performing automated fluid pressure imprint lithography on a substrate having a moldable surface comprising:
a source of pressurized fluid;
a pressure chamber for receiving the pressurized fluid and to apply the pressurized fluid to the sealed mold and substrate to press the molding surface into the moldable surface:
a mold having a molding surface having a protruding feature for molding the moldable surface of the substrate, and the mold positionable with the molding surface adjacent the moldable surface and the pressure chamber positioned for providing pressurized fluid from the source to press the molding surface into the moldable surface;
positioners for moving the mold and the substrate relative to each other;
a sensor providing an output related to the relative positions of the mold and the substrate
means for sealing the interface between the mold and the substrate; and
a controller coupled to the positioners, the sensor and the source of pressurized fluid for aligning the mold and the substrate prior to sealing and for imprinting the aligned mold into the substrate after sealing by controlling the introduction of pressurized fluid from the source into the chamber.

2. The apparatus of claim 1 wherein the positioners comprise an x-y positioner and a z-positioner, where z is the direction between the mold and the substrate.

3. The apparatus of claim 1 wherein the mold includes a first alignment mark and the substrate includes a second alignment mark.

4. The apparatus of claim 3 wherein the sensor couples to the first and second alignment marks to provide an alignment signal to the controller.

5. The apparatus of claim 4 wherein the sensor comprises an optical detector and the first and second alignment marks are optical alignment marks.

6. The apparatus of claim 5 wherein the optical alignment marks are chosen to generate a moiré alignment pattern.

7. The apparatus of claim 3 wherein the first and second alignment marks comprise plates of a capacitor and the sensor detects the capacitance between the marks.

8. The apparatus of claim 7 wherein the mold and substrate are aligned by maximizing the capacitance between the alignment marks.

9. The apparatus of claim 1 including an element to heat or cool the moldable surface.

10. The apparatus of claim 9 wherein the controller monitors and controls the temperature of the moldable surface during imprinting.

11. The apparatus of claim 1 wherein the molding surface includes at least one recessed feature and the mold depth between a protruding feature of the molding surface and a recessed feature is less than 250 nm.

12. The apparatus of claim 11 wherein the mold depth is in the range 5-250 nm.

13. The apparatus of claim 1 wherein the molding surface includes a layer of release material.

14. The apparatus of claim 13 wherein the release material is bonded to the molding surface.

15. The apparatus of claim 1 wherein the molding surface comprises a pattern for molding at least one feature with a minimum dimension of less than 25 nm.

16. The apparatus of claim 1 where the molding surface comprises a material selected from the group consisting of metals, metal oxides, metal carbides and metal nitrides.

17. The apparatus of claim 1 wherein the molding surface comprises a material selected from the group consisting of semimetals, semimetal oxides, semimetal carbides and semimetal nitrides.

18. The apparatus of claim 1 wherein the molding surface comprises a material selected from the group consisting of polymers, semiconductors, photoconductors, ceramics and glasses.

19. The apparatus of claim 1 wherein the molding surface comprises a plurality of layers.

20. The apparatus of claim 1 where the mold pattern comprises a uniform pattern.

21. The apparatus of claim 1 wherein the mold pattern comprises a random pattern.

22. The apparatus of claim 1 wherein at least a portion of a protruding feature of the molding surface has bonded thereto a release material comprising an inorganic linking group bonded to a molecular chain having release properties.

23. The apparatus of claim 1 wherein the molding surface comprises protruding features and recessed features for molding a pattern having at least one feature with minimum dimension of less than 200 nanometers.

24. The apparatus of claim 23 further comprising means for applying light or radiation to the moldable surface.

25. The apparatus of claim 24 wherein the means for applying light or radiation comprises a lamp or a laser.

26. The apparatus of claim 24 wherein the mold or the substrate is transparent to the light or the radiation.

27. The apparatus of claim 1 further comprising means for applying light or radiation to the moldable surface.

28. The apparatus of claim 27 wherein the means for applying light or radiation comprise a lamp or a laser.

29. The apparatus of claim 27 wherein the mold or the substrate is transparent to the light or the radiation.

* * * * *